United States Patent [19]

Pines et al.

[11] Patent Number: 4,968,938
[45] Date of Patent: Nov. 6, 1990

[54] METHOD AND SAMPLE SPINNING APPARATUS FOR MEASURING THE NMR SPECTRUM OF AN ORIENTATIONALLY DISORDERED SAMPLE

[75] Inventors: Alexander Pines, Berkeley, Calif.; Ago Samoson, Tallinn, U.S.S.R.

[73] Assignee: The Regents of the University of California, Berkeley, Calif.

[21] Appl. No.: 371,916

[22] Filed: Jun. 27, 1989

Related U.S. Application Data

[63] Continuation-in-part of Ser. No. 227,729, Aug. 3, 1989, Pat. No. 4,899,111.

[51] Int. Cl.$^5$ ............................................. G01R 33/20
[52] U.S. Cl. ..................................... 324/321; 324/307
[58] Field of Search ............... 324/300, 307, 308, 311, 324/318, 321

[56] References Cited

U.S. PATENT DOCUMENTS 4,301,410 11/1981 Wind et al. ...................... 324/321
4,352,066 9/1982 Kendrick et al. ................... 324/321

OTHER PUBLICATIONS

Azevedo, L. J., "Rotating Sample Holder Without Mechanical Linkages", Rev. Sci. Instrum, 50 (2), Feb. 1979.
Gates et al., "Low Temperature Sample Holders . . . Rotation About Two Orthogonal Axes", Rev. Sci. Instrum, 47 (1), Jan. 1976.

Primary Examiner—Hezron E. Williams
Assistant Examiner—Kevin D. O'Shea
Attorney, Agent, or Firm—McCubbrey, Bartels, Meyer & Ward

[57] ABSTRACT

An improved NMR apparatus and method are described which substantially improve the resolution of NMR measurements made on powdered or amorphous or otherwise orientationally disordered samples. The apparatus spins the sample about an axis. The angle of the axis is mechanically varied such that the time average of two or more Legendre polynomials are zero.

6 Claims, 5 Drawing Sheets

METHOD AND SAMPLE SPINNING APPARATUS FOR MEASURING THE NMR SPECTRUM OF AN ORIENTATIONALLY DISORDERED SAMPLE

This is a continuation-in-part of U.S. Ser. No. 227,729 filed on Aug. 3, 1989, now U.S. Pat. No. 4,899,111.

BACKGROUND OF THE INVENTION

The present invention relates to the measurement of nuclear magnetic resonance (NMR) and, in particular, to the NMR measurement of polycrystalline and/or amorphous solids.

Since its discovery in 1946, Nuclear Magnetic Resonance (NMR) has become a powerful analytical tool in studies of various liquid and solid materials. It is non-invasive and gives results which can be readily interpreted. The measured chemical shifts can be immediately associated with model structural units of the substance under study. In addition, relaxation rates provide information about molecular motions. Characteristic resonance frequencies of magnetic nuclei lie in a convenient radio-frequency (RF) range and can be detected with well-known electronic techniques.

An NMR experiment may be described as follows. Nuclei may be regarded as bar magnets that, because of their charge and nuclear spin, have associated magnetic moments. These magnetic moments are randomly oriented in the absence of external forces. When placed in an external magnetic field, these nuclei have discrete spin states. A quantized amount of energy is associated with each such spin state. The energy of each such state depends on the nuclear magnetic moment of the nuclei being studied and magnetic field in the vicinity of the nucleus in question. This magnetic field is the superposition of the external magnetic field and the magnetic fields generated by nearby electrons and nuclei. Hence, measurements of the energy levels associated with each of the spin states can provide information about the environment of the nuclei being studied.

An NMR measurement is made by determining the energy difference between nuclear spin states. In order to accomplish this, a sample of the material in question is placed in an external magnetic field and excited by applying a second, oscillating magnetic field in a direction perpendicular to the first steady field. This is accomplished by applying oscillating RF energy across a coil positioned perpendicular to the direction of the external magnetic field. A second magnetic field is created by a pulsing current in this coil. This second field causes transitions between nuclear spin states whose energies are determined by the first field. The energy absorbed by the nuclei during such an excitation or emitted thereby after such an excitation provides information on the differences in energy between the various spin states.

The accuracy of NMR measurements depends upon the physical form of the sample being studied. Highly accurate chemical shift determinations and separation of NMR lines are possible for liquid samples due to the random tumbling and rapid reorientation of sample molecules in solution. This rapid reorientation effectively causes the surroundings of the resonating nuclei to appear isotropic on the time scale of the NMR experiment.

If polycrystalline, powdery, glassy solids, or the like are studied, however, the observable lines are broadened due to different orientations of particles with respect to the static magnetic field. Anisotropic line broadening has traditionally rendered high-resolution work impossible with this type of sample.

Various methods have been employed in order to reduce the amount of line broadening observed for solid samples. For example, techniques in which crystalline materials are oriented in a particular direction with respect to the external magnetic field are known to the prior art. Unfortunately, such methods are impractical in many cases, since many solids cannot be obtained in single crystalline form nor oriented in a uniform direction throughout the material. In fact, many samples for which NMR spectra are desired exist only as powders or amorphous solids.

In the prior art, line broadening difficulties can be partially overcome by using magic angle spinning (MAS). Using this technique, the sample is rotated rapidly at an angle of 54.7 degrees with respect to the external magnetic field, i.e., the magic angle. For reasons that will be discussed in more detail below, this spinning removes so-called first order line broadening caused by such factors as chemical shift anisotropy, secular dipolar interactions, and first order quadrupole interactions. As a result, line widths on the order of 100 Hz are typically observed for non-quadrupole nuclei.

Although these line widths are a significant improvement over those obtained without MAS, they are still far broader than those obtained with liquid samples. Typically, line widths of 0.2 Hz are observed for liquids.

In the case of quadrupole nuclei, the line broadening is even worse. Line widths of quadrupole nuclei are determined primarily by second order quadrupole interactions, and are on the order of several KHz or more for light nuclei in strong magnetic fields. Magic angle spinning does not completely correct for this line broadening.

In a co-pending application (U.S. Ser. No. 227,729) an apparatus and method for reducing the line broadening from such second order interactions is disclosed. The apparatus in question re-orients the sample during the measurements such that the average values of certain generalized spherical harmonic functions is zero. This improved method and apparatus requires that the sample be moved in a time which is small compared to the NMR relaxation time for the sample being measured. An apparatus for providing this rapid reorientation of the sample is expensive to manufacture.

Furthermore, it is not always possible to provide this type of rapid reorientation. For example, if superconducting samples are to be studied, the samples must be maintained at very low temperatures. Providing rapid sample reorientation at such temperatures is difficult.

Accordingly, it is an object of the present invention to provide an improved apparatus for measuring nuclear magnetic properties of solids.

It is a further object of the present invention to provide an NMR apparatus with improved resolution for structural determinations of powdered or amorphous or otherwise orientationally disordered solid samples.

It is another object of the present invention to provide an apparatus and method which allows NMR spectra to be measured even when the sample cannot be moved in a time which is short compared to the NMR relaxation time.

These and other objects of the present invention will become apparent to those skilled in the art from the following detailed description of the invention and the accompanying drawings.

SUMMARY OF THE INVENTION

The present invention comprises an apparatus and method for measuring the NMR spectrum of a sample. The sample is place in a magnetic field and caused to spin about a sample axis inclined at a first angle, $\Theta_1$, with respect to the direction of said magnetic field. The sample is excited with a first electromagnetic pulse and the magnetization is allowed to precess for a first time interval, $T_1$, after the cessation of said first electromagnetic pulse. The sample is then excited with a second electromagnetic pulse having a predetermined phase relative to said first electromagnetic pulse. The sample axis is then rotated such that is is inclined at a second angle, $\Theta_2$ with respect to the direction of said magnetic field. The sample is then excited with a third electromagnetic pulse having a predetermined phase relative to said first electromagnetic pulse. After a second time interval, $T_2$, has elapsed from the cessation of said third electromagnetic pulse, the magnitude and phase of the electromagnetic energy emanating from said sample is measured. The angles, $\Theta_1$ and $\Theta_2$, and the time intervals, $T_1$ and $T_2$, are chosen such that $T_1 P_n(\cos(\theta_1)) + T_2 P_n(\cos(\theta_2)) = 0$ and $T_1 P_m(\cos(\theta_1)) + T_2 P_m(\cos(\theta_2)) = 0$, where $P_n$ and $P_m$ are Legendre polynomials of rank n and m, respectively, and n is not equal to m.

DETAILED DESCRIPTION OF THE INVENTION

Under rapid isotropic reorientation, anisotropic nuclear interactions are averaged away. Rotation and diffusion motions in liquids and collisions in gases are examples of naturally occurring molecular motions which provide such averaging. Nuclear spins in solids or partially oriented samples, in contrast, are locked in constraining or partially constraining environments and do not enjoy the benefit of rapid isotropic orientational randomization. The NMR spectra of powdered solids thus exhibit broad, and frequently featureless, lines reflecting the effects of the anisotropies of the spin interactions.

Consider an orientationally disordered sample which is comprised of particles or regions (sets of particles) which are small crystals, fragments thereof, or molecules. In the NMR experiment, the sample is placed in a magnetic field having a predetermined direction. The frequencies of electromagnetic energy absorbed or emitted by each particle will depend on its orientation relative to the magnetic field. Since the sample contains a continuous range of particle orientations, a broad spectrum is observed. The broadness of this spectrum limits the usefulness of such measurements.

Ideally, one would like to measure similar properties with solid samples as are measured in liquid samples, namely, the NMR frequencies of each particle or region averaged over all possible orientations of that particle or region. Such an average is independent of the particle size and constitutes a sensitive measure of the underlying physical properties of the material being measured.

In principle, one can accomplish this by melting or dissolving the sample and measuring the sample in the liquid state. However, many samples of interest can not be studied in this manner.

A second prior art technique, referred to as magic angle spinning, provides a partial averaging motion analogous to the natural motions that provide averaging in liquids and gases. The apparent first order anisotropy of the nuclei in a rapidly spinning disordered sample depends on the angle between the direction of the external magnetic field and the axis about which the sample is spun. By choosing the proper angle, improvements in the observed line widths are observed.

Figure 1:
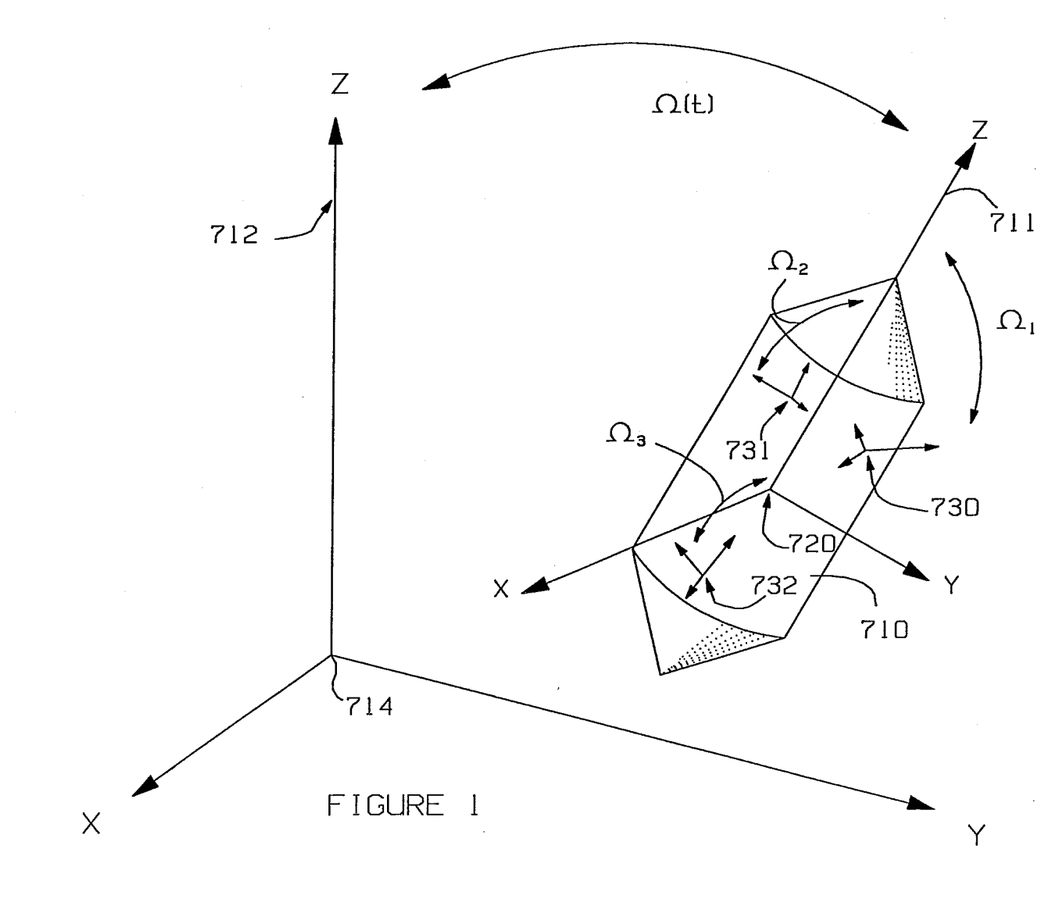
FIG. 1 illustrates the orientation of particles in a sample holder in a magnetic field.

The manner in which the magic angle is chosen may be most easily understood with reference to FIG. 1. A sample is placed in a rotor 710 which is located in a magnetic field having the direction shown at 712. The magnetic field defines a first coordinate system having axes shown at 714. The sample rotor may be described with reference to a second coordinate system shown at 720. At any given time, the angular relationship of this coordinate system with respect to first coordinate system 714 may be specified by giving the values of a set of angles $\Omega(t)$. As rotor 710 moves, $\Omega(t)$ changes.

Within the rotor, each particle or region of the sample has its own orientation which may be specified by a coordinate system associated with that particle or region. Exemplary particle coordinate systems are shown at 730-732. Each of the particle coordinate systems may be specified with respect to coordinate system 720 by giving the values of a set of angles $\Omega$. Particle coordinate system 730 is specified by $\Omega_1$, particle coordinate system 731 is specified by $\Omega_2$, and particle coordinate system 732 is specified by $\Omega_3$. It should be noted that 106$_1$, $\Omega_2$, and $\Omega_3$ are constants whose values are fixed once the sample is placed in rotor 710.

Each set of angles, $\Omega$, consists of three angles, $\alpha$, $\Theta$ and $\phi$, which specify the angles between the two relevant coordinate systems.

It may be shown that, to a good approximation, the NMR frequencies emitted by the ith particle or region due to secular interactions up to rank L in the sample are given by $$\omega(\Omega_i, \Omega(t)) = \omega_0 + \Sigma\Sigma A_{lm}(\Omega_i)Y_{lm}(\Omega(t)) \qquad (1)$$

Here, the values of $A_{lm}$ depend on $\Omega_i$ and the chemical properties of the sample. The functions $Y_{lm}$ are the generalized spherical harmonic functions of rank l. For each rank l, there is a set of $2l+1$ such functions. That is, m takes on the values from $-l$ to $+l$. These functions depend only on two angles, the angle between the sample axis and the magnetic field direction and the angle between the projection of the magnetic field in the xy-plane and the x-axis of the sample related frame.

For the purposes of this discussion, $$D_i = \Sigma\Sigma A_{lm}(\Omega_i) Y_{lm}(\Omega(t)) \quad (2)$$

will be referred to as the frequency dispersion due to secular interactions contributed by the ith particle or region in the sample. The measured NMR signal is the sum of the signals emitted by each of the particles. Each particle contributes a constant set of frequencies $\omega_0$ to the spectrum and a frequency dispersion, $D_i$, which is different for each particle, since each particle has a different orientation.

The frequencies $\omega_0$ depend only on the chemical properties of the sample. Ideally, it is these frequencies that one would like to measure. However, these frequencies are masked by frequency dispersion terms which are different for different particles or regions. These terms give rise to the broad, often featureless, spectra observed for orientationally disordered samples.

When rotor 710 is spun sufficiently fast about its axis 711, the measured spectrum for the ith particle is the average of the spectrum given in Eq. (1), the average being taken over the range of $\Omega(t)$ angles realized by the spinning motion. Hence, the contribution of the ith particle becomes $$<\omega(\Omega(t))> = \omega_0 + \Sigma\Sigma A_{lm}(\Omega_i) <Y_{lm}(\Omega(t))> \quad (3)$$

Here, $<>$ denotes the average value of the quantity enclosed by the brackets. When rotor 710 is spun about axis 711, the average value of the generalized spherical harmonics, $<Y_{lm}(\Omega(t))>$, is zero for all m values other than 0. For m=0, $$<Y_{l0}(\Omega(t))> = P_l(\cos\Theta) \quad (4)$$

where $P_l$ denotes the Leqendre polynomial of order l and $\Theta$ is the angle between the direction of the magnetic field, i.e., direction 712, and rotor axis 711.

Hence, when rotor 710 is spun about axis 711, the frequency dispersion contributed by each particle is given by $$D_i = \Sigma B_l P_l(\cos\Theta) \quad (5)$$

Here, the $B_l$ are constants that depend on the properties of the sample.

In the case of magic angle spinning, $\Theta$ is chosen such that $P_2(\cos\Theta)$ is zero, i.e., $\Theta = 54.7$ degrees. Spinning a sample at the magic angle described above thus removes so-called first order line broadening. First order line broadening effects are proportional to the $P_2$ term, and correspond primarily to chemical shift anisotropy, secular dipolar interactions, and first order quadrupole interactions.

The approach just described leads to a significant reduction in observed line widths only when the $P_2$ term in Eq. (5) is the major contributor to the frequency dispersion. This is the case for NMR measurements based, for example, on $C^{13}$, $Si^{29}$, and $P^{31}$.

Unfortunately, many cases of interest do not satisfy this constraint. For example, both the $P_2$ and $P_4$ terms are significant for $B^{11}$, $O^{17}$, $Na^{23}$, and $Al^{27}$. These cases correspond primarily to second order quadrupole broadening. Broadening due to second order dipole—dipole interactions and susceptibility anisotropy can also contribute to the observed frequency dispersion in magic angle spinning of the spin one half nuclei, e.g., $C^{13}$ mentioned above. When such physical effects are present, more than one of the Legendre polynomial terms is important. Although spinning the sample at the magic angle provides some improvement in these cases, the resultant spectra are still too broad to provide all the data sought in NMR measurements based thereon.

A method for improving the poor resolution of NMR spectra for orientationally disordered systems, which has been suggested in the prior art, is to increase the magnetic field strength. It can be shown that the resolution of an NMR measurement which is limited by second order line broadening increases as the magnetic field is increased. Unfortunately, unrealistically high magnetic fields are often required to remove the line broadening observed with powders.

When two or more terms in the Legendre expansion are significant, some additional improvement can be obtained by adjusting the spin angle empirically to minimize the observed frequency dispersion. However, if more than one term in the Legendre expansion is important, the frequency dispersion is often still too large to provide useful data.

In the above cited co-pending U.S. Patent application an apparatus and method that provides a major reduction in frequency dispersion even when two or more of the terms in Eq. (5) are significant is taught. The apparatus in question utilizes a more complex pattern of motion so as to enable a more averaged measurement of the frequency of electromagnetic energy absorbed or emitted by each particle in an orientationally disordered sample. Magic angle spinning only averages the frequencies over a limited range of sample orientations. Hence, it does not provide the same resolution as obtained in liquids where the averaging is performed over all possible orientations of each particle or region of the sample with respect to the direction of the magnetic field.

Figure 2:
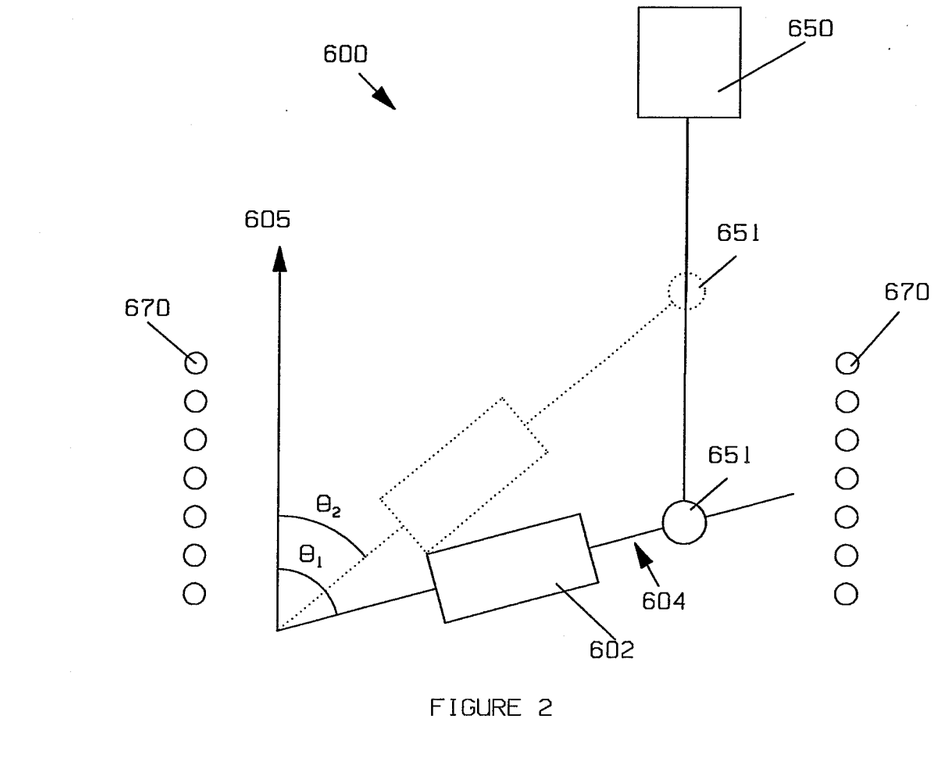
FIG. 2 illustrates the preferred embodiment an apparatus according to the present invention.

A cross-sectional view of an apparatus for providing this more complex motion is illustrated in FIG. 2 at 600. The sample is placed in a sample holder 602 which spins about an axis 604. Axis 604 is hinged such that it pivots between angles $\Theta_1$ and $\Theta_2$ with respect to the direction 605 of the magnetic field during the time period in which the NMR spectrum is measured. The pivoting is controlled by an actuator 650 which may be pneumatically driven. Actuator 650 includes a means 657 for coupling axis 604 to actuator 650. This pivoting apparatus differs from prior art NMR systems such as "variable angle spinning" or the prior art technique of two-dimensional correlation experiments in that the pivoting parameters are chosen so as to eliminate the contributions of two or more Legendre polynomials by moving the sample during the time the NMR spectra are being measured. In contrast, in variable angle spinning, the angle of the axis about which the specimen spins is fixed during the time the spectrum is measured.

The sample is excited by an RF pulse through a coil such as coil 670. In the following discussion, it will be assumed that the coil is fixed relative to the magnetic field. However, embodiments in which the coil is fixed relative to the holder 602 apparent to those skilled in the NMR arts. The latter arrangement has the advantage of requiring lower power RF signals and higher power detected signals. If such an arrangement is used, however, the signals must be corrected for the angular position of the sample holder. Such corrections are avoided if the coil remains fixed.

The pivoting motion can be accomplished by moving axis 604 using a suitable mechanical mechanism. Such mechanisms are included in many NMR spectrometers, where they are used to adjust the angle of spinning of the sample. The motion of the axis is such that said axis is confined to a plane. By choosing $\Theta_1$, $\Theta_2$, and the manner in which the axis pivots, the contributions to the frequency dispersion resulting from two or more terms in Eq. (5) may be eliminated.

In the general case, the following condition must be satisfied to eliminate $P_n$:

$$\int P_n(\cos\Theta) W(\Theta) d\Theta = 0 \quad (6a)$$

where $W(\Theta)$ is proportional to the time spent at each angle $\Theta$, and the integral is over the realized values of $\Theta$. As will become apparent from the following discussion a total time of 2T is spent at the various angles where $$\int W(\Theta) d\Theta = 2T \quad (6b)$$

A sinusoidal motion for axis 604 is particularly easy to implement. For example, $$\Theta(t) = \Theta_1 + (\Theta_2 - \Theta_1) \cos(\alpha t) \quad (7)$$

where $\alpha$ is a constant. In this case, it can be shown that the $P_2$ and $P_4$ terms can be eliminated if $\Theta_1 = 23.27$ degrees and $\Theta_2 = 117.37$ degrees.

If more than two terms in Eq. (5) are to be eliminated, one must introduce correspondingly more free parameters into Eq. (6a). This may be accomplished by utilizing motions that are more complex than the linear or sinusoidal motions described above. For example, axis 604 could be programmed to make discrete "flips" between N discrete angles, $\Theta_i$, where i runs from 1 to N. In this case, $W(\Theta)$ would be the sum of a number of delta functions. That is, $W(\Theta)$ would be zero except when $\Theta$ was equal to $\Theta_i$, for some value of i between 1 and N. The values of the $\Theta_i$ and $W(\Theta)$ would determined such that the desired terms in Eq. (5) were eliminated. For example, in the case of discrete flips between two angles $\Theta_1$ and $\Theta_2$ in which the rotor spends equal time at each angle, $W(\Theta_1) = W(\Theta_2) = T$, the polynomials $P_2$ and $P_4$ can be eliminated with $\Theta_1 = 37.38$ degrees, and $\Theta_2 = 79.19$ degrees. If $\Theta_1 = 39.23$ degrees, $\Theta_2 = 90$ degrees and $W(\Theta_1) = 1.25 W(\Theta_2)$, then the contributions to Eq. (5) from the three Legendre polynomials $P_2$, $P_3$, and $P_4$ can be eliminated simultaneously.

The above flipping must be accomplished in a time which is short compared to the NMR time scale. In general, this is difficult to accomplish with economically feasible mechanical mechanisms. The present invention overcomes this difficulty by utilizing so called storage techniques to effectively freeze the magnetization of the sample during the flips between the various locations. This allows more economical mechanical motions to be used; however, it increases the complexity of the experimental protocol.

The method in which the present invention operates may be most easily understood with reference to an NMR experiment in which the axis flips between two discrete angles, $\Theta_1$ and $\Theta_2$, and the sample spends equal times at each angle. FIG. 3 illustrates the positions of the sample and the magnetization vector for the sample during a single NMR measurement. The upper portion of each drawing in FIG. 3 illustrates the sample position, and the lower drawing illustrates the position of the magnetization. In the following discussion, it will be assumed that the applied magnetic field is along the z-axis of a cartesian coordinate system which is shown in the lower part of FIG. 3(a). The initial position of the sample is shown in the upper part of FIGS. 3(a-c). The magnetization of the sample will also be initially along this z-axis. At the beginning of the experiment, an RF pulse is applied to the sample utilizing the coil 670.

Figure 3A:
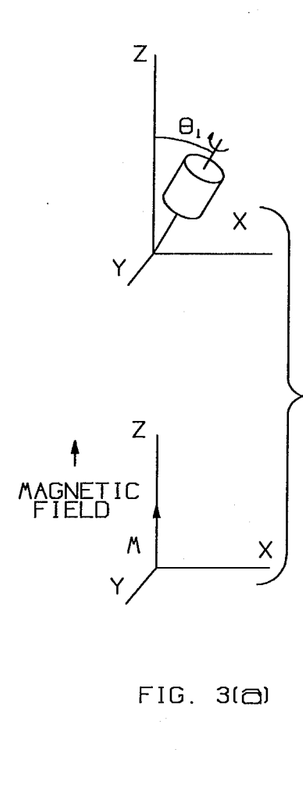
FIG. 3 illustrates the rotor and magnetization positions during an ideal NMR experiment.
Figure 3B:
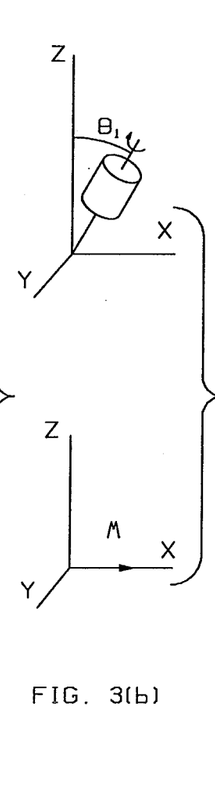

The RF pulse causes the magnetization of the sample to tip such that it is perpendicular to the z-axis. The position of the magnetization vector M after the RF pulse is shown in FIG. 3(b). By adjusting the phase of the RF signal, the magnetization of the sample will be tipped such that it lies along the x-axis. The NMR frequency $\omega 0$ is the rate at which the magnetization vector precesses about the z-axis after it has been so tipped. It is this precession frequency that one wishes to measure.

Figure 3C:
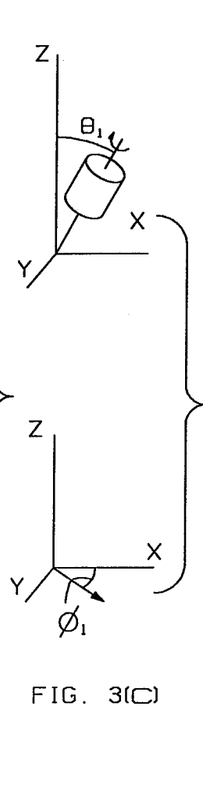
Figure 3D:
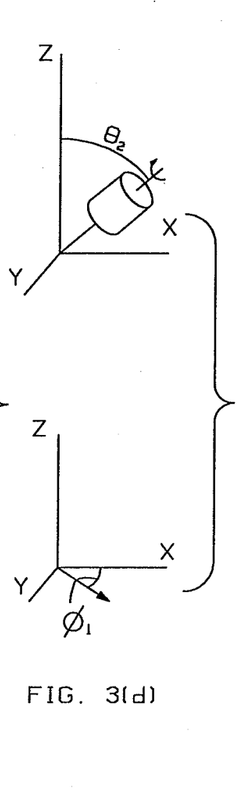
Figure 3E:
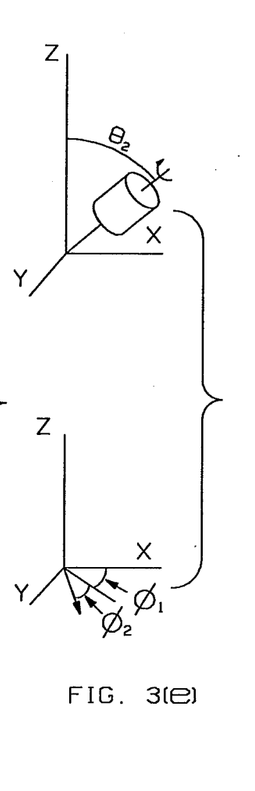

After a time T elapses, the magnetization vector, M, will have rotated through an angle $\Theta_1$ as shown in FIG. 3(c). The sample holder will still be spinning at an angle $\Theta_1$ with reference to the z-axis. At this point in time, the sample axis is instantaneously flipped to the second angle $\Theta_2$ as shown in FIG. 3(d). After a second time interval of T has elapsed, M will have precessed through a further angle of $\Theta_2$ as shown in FIG. 3(e). The sum of $\Theta_1$ and $\Theta_2$ is equal to the average value of $\omega 0$ over the 2T time interval.

The value of this sum angle may be obtained from the phase of the RF signal detected in the coil which was originally used to excite the sample. After the sample has been excited by the RF pulse, the coil used to excite the sample is typically used to receive RF energy radiated by the sample. The magnitude an phase of this detected signal measures the projection of the magnetization in the xy-plane as the magnetization varies in response to the interactions within the sample. In the preferred embodiment of the present invention, the coil is connected to a circuit which provides an x-output and a y-output. The x-output is the product of magnitude of the signal and the cosine of the phase angle. The y-output is the product of the magnitude of the signal and the sine of the phase angle. The RF signals used to tip the magnetization vector are also inputted through this coil and are likewise inputted through x and y inputs which are analogous to the outputs described above.

If $\omega 0$ were a pure single frequency, a single measurement would be sufficient. However, in general, $\omega 0$ is a frequency spectrum with a number of discrete lines. Hence, the above described measurement must be repeated for different values of T, each measurement yielding one value for $\phi = \phi_1 + \Theta_2$. The Fourier transform of the function $e^{i\Theta}$ is then calculated. The resultant function is the conventional NMR spectrum for the sample. For a different choice of angles and/or polynomials to be eliminated, time slices $T_1$, $T_2$, . . . may have a fifferent ratio and assume increments proportional to that ratio.

As noted above, instantaneous flipping is difficult to achieve. In general, one wishes to flip the sample axis in a time which is so small that the magnetization vector, M, is the same before and after the "flip". Since it is difficult to move the sample in this short a time, the present invention operates by effectively freezing one component of the magnetization and thereby preventing it from changing during the time the sample axis is moving between $\Theta_1$ and $\Theta_2$. In the simple two angle experiment described above, two experiments are performed for each time point. In each experiment a different component of the magnetization is frozen prior to flip sample axis. Data from these two experiments are then combined to calculate the value of $\phi$.

The manner in which these two experiments are combined to produce a measurement is most easily understood with reference to FIGS. 4 and 5. These figures are analogous to FIG. 3 in that the top drawings shows the position of the sample rotor, and the bottom drawings show the position of the magnetization vector, M. FIG. 4 illustrates the sample holder axis and magnetization vectors at various times during the first experiment. FIG. 5 illustrates the sample holder axis and magnetization vectors at various times during the second experiment. The axes of the cartesian coordinate system and direction of the applied magnetic field are the same as described with reference to FIG. 3 above. At time t=0 an RF pulse is applied to the sample which causes magnetization vector, M, to tip such that it is now in the xy-plane. The RF pulse is applied by inputting separate x and y signals to the coil control circuit described above. The phase of the RF pulse is adjusted so that the magnetization vector M is initially along the x-axis.

Figure 4A:
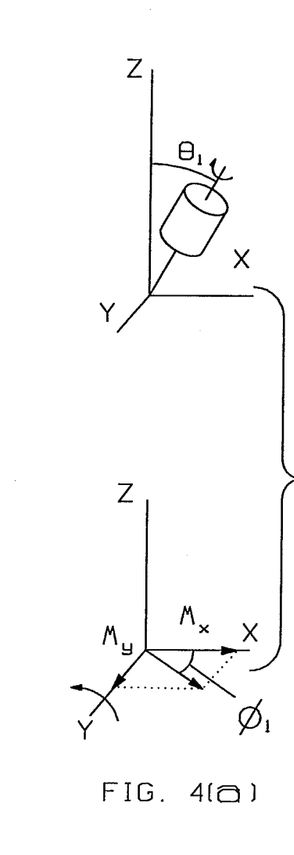
FIG. 4 illustrates the rotor and sample magnetization position during the first of two experiments used with the present invention.
Figure 4B:
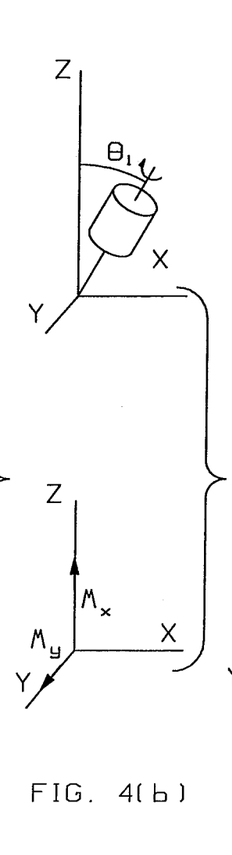

After a time T elapses, M will have rotated through an angle $\Theta_1$ as shown in FIG. 4(a). The magnetization vector may be decomposed into components $M_x$ and $M_y$ along the various x and y axes, respectively. At this point in time, an RF signal is applied to the coil which causes the magnetization vector to rotate in space. The direction of this rotation is different for each of the experiments. The direction of the rotation is determined by the phase of the applied RF signal. In the first experiment, the axis of rotation is the y-axis. This is the same axis of rotation as that used to tip the magnetization vector away from the z-axis. Hence, a pulse having a phase which is 180 degrees from that of the original RF pulse is used. After this rotation, the component of the magnetization that was along the x-axis will now be along the z-ax as shown in FIG. 4(b).

Figure 4C:
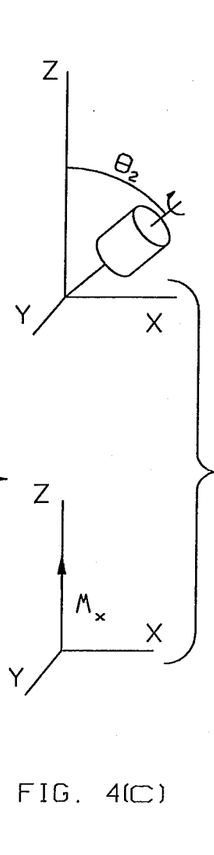
Figure 4D:
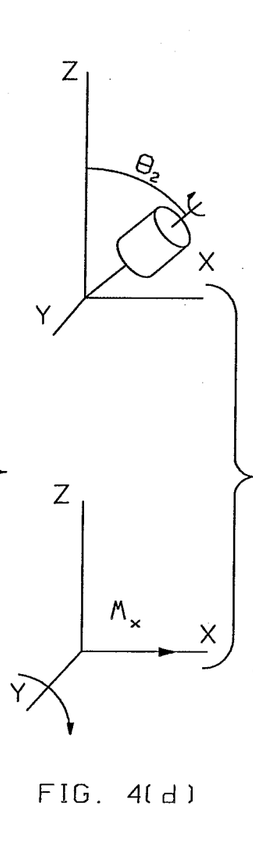

At this point in time, the sample axis is flipped to $\Theta_2$. The flipping takes a time which is long compared to precession period of the magnetization vector. During this time, the component of the magnetization along the y-axis will have decayed to zero. However, the component along the z-axis will not have decayed because of the the laws of quantum mechanics. Hence, after the sample axis has been moved to $\Theta_2$, the magnetization will be as shown in FIG. 4(c). That is, it will be along the z-axis and have a magnitude equal to that of $M_x$. Next, a third RF pulse is applied to the sample having a phase which is the same as the phase of the first RF pulse. This causes the magnetization to rotate 90 degrees around the y-axis such that it is now aligned with the x-axis as shown in FIG. 4(d).

Figure 4E:
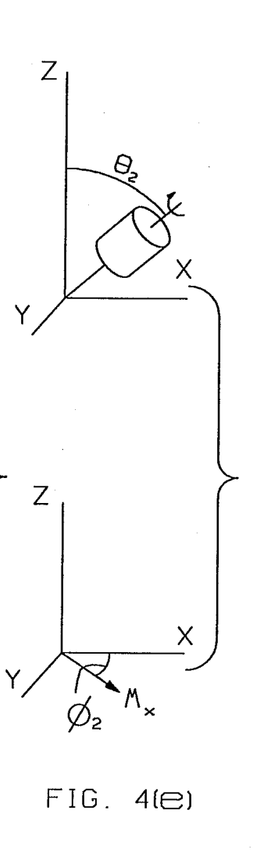

After a further time interval of T, the magnetization will have precessed through an angle $\phi_2$ as shown in FIG. 4(e). The signals from the x and y outputs of the coil at this point in time will have magnitudes equal to $M_x\cos(\phi_2)$ and $M_x\sin(\phi_2)$, respectively. Since $M_x$ is equal to $M\cos(\phi_1)$, the x and y outputs will have signals equal to $M\cos(\phi_1)\cos(\phi_2)$ and $M\cos(\phi_1)\sin(\phi_2)$, respectively.

FIG. 5 illustrates the sample axis and magnetization vectors at various times during the second experiment. At time t=0 an RF pulse is applied as in the first experiment. The magnetization vector, M, after this pulse lies along the x-axis as in the first experiment.

Figure 5A:
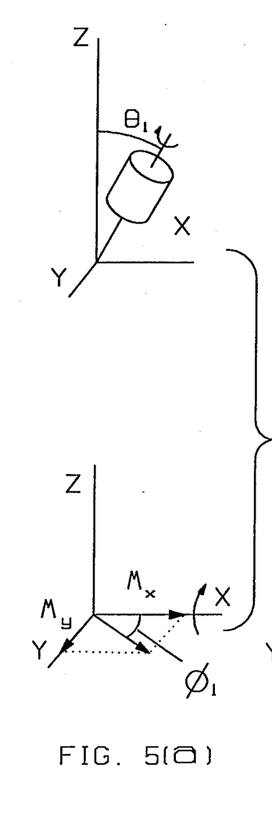
FIG. 5 illustrates the rotor and sample magnetization position during the second of two experiments used with the present invention.
Figure 5B:
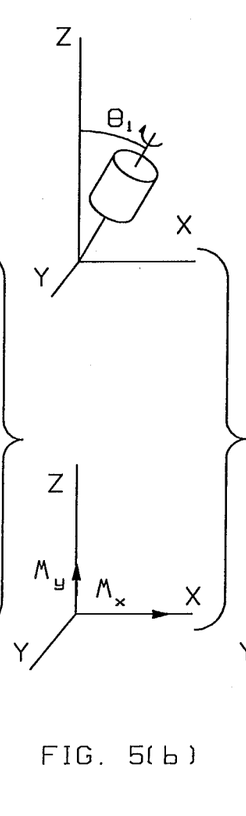

After a time T has elapsed, M will have again rotated through an angle $\phi_1$ as shown in FIG. 5(a). At this point in time, an RF signal is applied to the coil which causes the magnetization vector to rotate about the x-axis. This is accomplished by applying an RF pulse which differs in phase by 90 degrees from that used to rotate the magnetization about the y-axis. After this rotation, the component of the magnetization that was along the y-axis will now be along the z-axis as shown in FIG. 5(b).

Figure 5C:
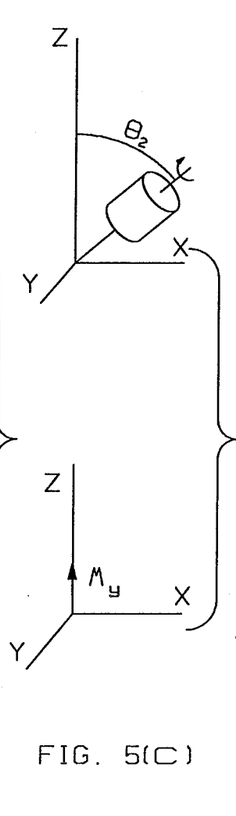
Figure 5D:
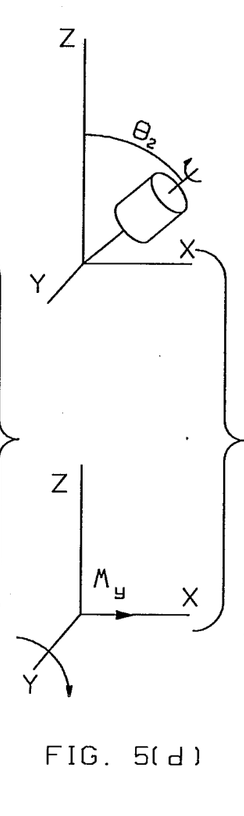

At this point in time, the sample axis is flipped to $\Theta_2$. The flipping takes a time which is long compared to precession period of the magnetization vector. During this time, the component of the magnetization along the x-axis will have decayed to zero, leaving only the component along the z-axis, as shown in FIG. 5(c). A third RF pulse is then applied to the sample having a phase which is the same as the phase of the first RF pulse. This causes the magnetization to rotate 90 degrees around the y-axis such that it is now aligned with the x-axis as shown in FIG. 5(d). The magnitude of the magnetization vector will now be $M_y$.

Figure 5E:
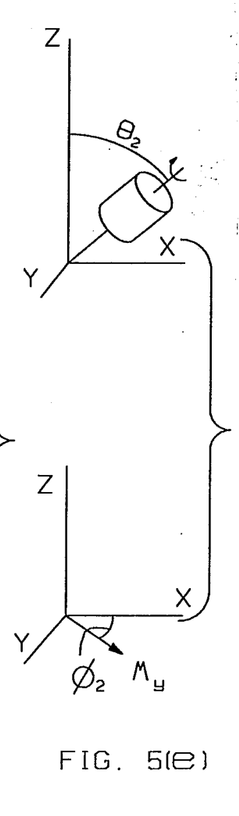

After a further time interval of T, the magnetization will have precessed through an angle $\phi_2$ as shown in FIG. 5(e). The signals from the x and y outputs of the coil at this point in time will have magnitudes equal to $M_y\cos(\phi_2)$ and $M_y\sin(\phi_2)$, respectively. Since $M_y$ is equal to $M\sin(\phi_1)$, the x and y outputs will have signals equal to $M\sin(\phi_1)\cos(\phi_2)$ and $M\sin(\phi_1)\sin(\phi_2)$, respectively.

If one sums the x outputs from the two experiments, one obtains $$M\cos(\phi_1)\cos(\phi_2)+M\sin(\phi_1)\cos(\phi_2)=M\cos(\phi_1+\phi_2). \quad (8)$$

Similarly, the sum of the y outputs is $$M\cos(\phi_1)\sin(\phi_2)+M\sin(\phi_1)\sin(\phi_2)=M\sin(\phi_1+\phi_2). \quad (9)$$

After the above two experiments have been repeated for a number of different times T, the function $$e^i(\phi1+\phi2)=\cos(\phi_1+\phi_2)+i\sin(\phi_1+\phi_2) \quad (10)$$

is constructed and the Fourier transform of said function calculated. As pointed out above, the resultant function is the NMR frequency spectrum.

Storage experiments of the type discussed above are known to those in the NMR arts, and hence further details of such experiments are not presented here.

Although the above embodiment of the present invention utilized equal dwell times at the two angles, it will be apparent to those skilled in the art that different dwell times and angles may be utilized provided the time average of each of the two Legendre polynomials is zero.

Similarly, the above embodiment of the present invention utilized RF pulses which caused the magnetization to be rotated about particular angles through 90 degrees. It will be apparent to those skilled in the art that other phase relationships may be utilized to determine the angle through which the magnetization precessed after the sample has spent the first time interval at the first angle and the second time interval at the second angle.

In addition, embodiments in which more than two angles are utilized will also be apparent to those skilled in the art. As noted above, such experiments allow the contributions of more than two of the Legendre polynomials to be eliminated. The number of storage experiments that must be carried out in this more general case is $2^{n-1}$, where n is the number of angles.

Accordingly, there has been described herein a novel apparatus and method for performing NMR measurements. Various modifications to the present invention will become apparent to those skilled in the art from the foregoing description and accompanying drawings. Hence, the present invention is to be limited solely by the scope of the following claims.

What is claimed is:

1. A method for measuring an NMR spectrum of a sample comprising the steps of
   generating a magnetic field in said sample;
   causing said sample to spin about a sample axis inclined at a first angle, $\Theta_1$, with respect to the direction of said magnetic field;
   exciting said sample with a first electromagnetic pulse;
   allowing the magnetization of said sample to precess for a first time interval, $T_1$, after the cessation of said first electromagnetic pulse;
   exciting said sample with a second electromagnetic pulse having a predetermined phase relative to said first electromagnetic pulse;
   causing said sample axis to be inclined at a second angle, $\Theta_2$, with respect to the direction of said magnetic field;
   exciting said sample with a third electromagnetic pulse having a predetermined phase relative to said first electromagnetic pulse;
   allowing the magnetization of said sample to precess for a second time interval, $T_2$, after the cessation of said third electromagnetic pulse; and
   detecting the magnitude and phase of the electromagnetic energy emanating from said sample:
   wherein $\Theta_1$, $\Theta_2$, $T_1$, and $T_2$ are chosen such that
   $T_1 P_n(\cos(\Theta_1)) + T_2 P_n(\cos(\Theta_2)) = 0$ and
   $T_1 P_m(\cos(\Theta_1)) + T_2 P_m(\cos(\Theta_2)) = 0$, where
   $P_n$ and $P_m$ are Legendre polynomials of rank n and m, respectively, and n is not equal to m.

2. The method of claim 1 wherein $n=2$ and $m=4$.

3. The method of claim 1 wherein $T_1 = T_2$.

4. An apparatus for measuring an NMR spectrum of a sample in a magnetic field comprising:
   means for causing said sample to spin about a sample axis inclined at a first angle, $\Theta_1$, with respect to the direction of said magnetic field;
   means for causing said sample axis to be inclined at a second angle, $\Theta_2$, with respect to the direction of said magnetic field;
   electromagnetic exciting means for exciting said sample with first, second and third electromagnetic pulses, said
   second electromagnetic pulse having a predetermined phase relative to said first electromagnetic pulse, said second electromagnetic pulse being applied at a time $T_1$ after the cessation of said first electromagnetic pulse;
   said third electromagnetic pulse having a predetermined phase relative to said first electromagnetic pulse, said third electromagnetic pulse being applied after said sample axis has been inclined at $\Theta_2$ with respect to the direction of said magnetic field; and
   means for detecting the magnitude and phase of the electromagnetic energy emanating from said sample at a time $T_2$ after the cessation of said third electromagnetic pulse;
   wherein $\Theta_1$, $\Theta_2$, $T_1$, and $T_2$ are chosen such that
   $T_1 P_n(\cos(\Theta_1)) + T_2 P_n(\cos(\Theta_2)) = 0$ and
   $T_1 P_m(\cos(\Theta_1)) + T_2 P_m(\cos(\Theta_2)) = 0$, where
   $P_n$ and $P_m$ are Legendre polynomials of rank n and m, respectively, and n is not equal to m.

5. The apparatus of claim 4 wherein $n=2$ and $m=4$.

6. The apparatus of claim 4 wherein $T_1 = T_2$.

* * * * *

UNITED STATES PATENT AND TRADEMARK OFFICE
CERTIFICATE OF CORRECTION

PATENT NO. : 4,968,938
DATED : November 6, 1990
INVENTOR(S) : Pines, et al.

It is certified that error appears in the above-identified patent and that said Letters Patent is hereby corrected as shown below:

Column 3, Line 30, delete "is" and insert therefor --it--.

Column 5, Line 24, delete "$<\omega(\Omega(t))> = \omega_0 + \Sigma\Sigma A_{lm}(\Omega i)<Y_{lm}(\Omega(t))>$" and insert therefor --$<\omega(\Omega i, \Omega(t))> = \omega_0 + \Sigma\Sigma A_{lm}(\Omega i)<Y_{lm}(\Omega(t))>$--.

Column 6, Line 44, delete "657" and insert therefor --651--.

Column 6, Line 59, insert "will be" therefor after --602--.

Column 8, Line 31, delete "an" and insert therefor --and--.

Column 8, Line 49, delete "$\theta_2$" and insert therefor --$\phi_2$--.

Column 8, Line 54, delete "fifferent" and insert therefor --different--.

Column 12, Line 32, insert ")" therefor after --$\theta_1$--.

Column 12, Line 32, insert ")" therefor after --$\theta_2$--.

Column 12, Line 33, insert ")" therefor after --$\theta_1$--.

Column 12, Line 33, insert ")" therefor after --$\theta_2$--.

UNITED STATES PATENT AND TRADEMARK OFFICE
CERTIFICATE OF CORRECTION

PATENT NO. : 4,968,938

DATED : November 6, 1990

INVENTOR(S) : Pines, et al

It is certified that error appears in the above-identified patent and that said Letters Patent is hereby corrected as shown below:

Column 3, line 21, delete "place" and insert therefor --placed--.

Signed and Sealed this

Eleventh Day of August, 1992

Attest:

DOUGLAS B. COMER

Attesting Officer      Acting Commissioner of Patents and Trademarks